United States Patent
Högerl

(10) Patent No.: US 6,646,333 B1
(45) Date of Patent: Nov. 11, 2003

(54) SEMICONDUCTOR MODULE HAVING INTERCONNECTED SEMICONDUCTOR CHIPS DISPOSED ONE ABOVE THE OTHER

(75) Inventor: Jürgen Högerl, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/577,065

(22) Filed: May 22, 2000

(30) Foreign Application Priority Data

May 21, 1999 (DE) .......................... 199 23 523

(51) Int. Cl.$^7$ .................. H01L 23/02; H01L 23/48; H01L 23/04; H01L 23/34
(52) U.S. Cl. ............... 257/686; 257/697; 257/698; 257/723; 257/774; 257/779; 257/680; 257/707
(58) Field of Search ................. 257/686, 697, 257/707, 780, 738

(56) References Cited

U.S. PATENT DOCUMENTS

| | | | |
|---|---|---|---|
| 4,640,010 A | * 2/1987 | Brown | 29/832 |
| 4,841,355 A | * 6/1989 | Parks | 357/82 |
| 5,016,138 A | * 5/1991 | Woodman | 361/381 |
| 5,111,278 A | 5/1992 | Eichelberger | |
| 5,128,831 A | 7/1992 | Fox et al. | |
| 5,241,456 A | * 8/1993 | Marcinkiewicz et al. | 361/792 |
| 5,280,192 A | * 1/1994 | Kryzaniwsky | 257/723 |
| 5,763,939 A | * 6/1998 | Yamashita | 257/668 |
| 5,910,010 A | 6/1999 | Nishizawa et al. | |
| 6,072,233 A | * 6/2000 | Corisis et al. | 257/686 |

FOREIGN PATENT DOCUMENTS

| | | |
|---|---|---|
| DE | 43 03 734 C2 | 7/1996 |
| EP | 0 802 566 A2 | 4/1996 |

OTHER PUBLICATIONS

Japanese Patent Abstract No. E–1162 (Hiroki), dated Feb. 5, 1992, vol. 16, No. 45.
Japanese Patent Abstract No. E–283 (Yoshino), dated Dec. 7, 1984, vol. 8, No. 268.

* cited by examiner

*Primary Examiner*—Steven Loke
*Assistant Examiner*—Nitin Parekh
(74) *Attorney, Agent, or Firm*—Laurence A. Greenberg; Werner H. Stemer; Gregory L. Mayback

(57) ABSTRACT

A semiconductor module has a plurality of semiconductor chips which are provide on chip carriers in a housing. At least some of the semiconductor chips are disposed one above the other and there are conductive connections between the chip carriers of the semiconductor chips disposed one above the other. The conductive connections are formed by plug-in connections and extend through openings in the chip carriers. The openings may be lined with a conductive layer. In an alternative embodiment intermediate layers are provided between the semiconductor chips disposed one above the other. The intermediate layers have conductive projections which engage in the openings in the chip carriers for forming conductive connections.

6 Claims, 4 Drawing Sheets

SEMICONDUCTOR MODULE HAVING INTERCONNECTED SEMICONDUCTOR CHIPS DISPOSED ONE ABOVE THE OTHER

BACKGROUND OF THE INVENTION

Field of the Invention

The invention relates to a semiconductor module having semiconductor chips disposed in different planes in a housing. U.S. Pat. No. 5,128,831 describes a configuration in which a conductive connection is established between chip carriers after individual semiconductor chips with their chip carriers have been provided one above the other. In order to produce the conductive connection, the entire module is dipped into a solder bath and a local vacuum is applied to the openings in order to suck the solder into the openings and thus establish conductive soldered connections between the individual planes of the semiconductor chips or of the chip carriers. This method is relatively complicated since, on the one hand, a vacuum environment has to be provided and, on the other hand, appropriate tightness of the semiconductor module also has to be ensured. On the other hand, there is the risk of contamination or short circuits in the semiconductor module if the liquid solder composition escapes from the openings.

SUMMARY OF THE INVENTION

It is accordingly an object of the invention to provide a semiconductor module which overcomes the above-mentioned disadvantages of the heretofore-known semiconductor modules of this general type and which can be produced in a simple and reliable manner.

With the foregoing and other objects in view there is provided, in accordance with a first embodiment of the invention, a semiconductor module, including:

a housing;

a first chip carrier formed with a first opening and a second chip carrier formed with a second opening, the first and second chip carriers disposed in the housing and stacked on top of each other;

a first semiconductor chip provided on the first chip carrier and a second semiconductor chip provided on the second chip carrier; and a conductive plug-in connection electrically connected to the first and second semiconductor chips, the conductive plug-in connection extending through the first and second openings.

In other words, a semiconductor module is provided in which semiconductor chips are disposed in a housing, in particular in a common housing. The semiconductor chips are provided on chip carriers. Each semiconductor chip may be provided on a separate chip carrier. Alternatively a plurality of semiconductor chips may be provided on a common chip carrier. At least some of the semiconductor chips with their respective chip carrier are in this case provided one above the other, thereby producing a stacked configuration of the semiconductor chips. A conductive connection is provided between the chip carriers disposed one above the other and, if appropriate, also next to one another. The conductive connections lead through openings in the chip carriers and a conductive connection is in each case established from the openings to the semiconductor chips, or to at least one of the contacts of the semiconductor chip.

In the case of the first embodiment of the invention, the semiconductor module has a plurality of semiconductor chips, which are disposed in a housing in a manner such that they are each provided on a chip carrier. At least some of the semiconductor chips with their chip carriers are provided one above the other and there are conductive connections between the chip carriers of the semiconductor chips disposed one above the other. The conductive connections between the chip carriers are formed by plug-in connections, they lead through openings in the chip carriers and are conductively connected to the semiconductor chips. Such plug-in connections are simple to produce and also easy to handle. The use of a liquid solder composition or the necessity of sealing the component is thus obviated.

The plug-in connections may either be provided in a releasable manner in the semiconductor module, with the result that, for repair purposes for example, defective semiconductor chips are removed from the module. However, the plug-in connections may also be connected to at least one of the chip carriers by a soldered connection.

With the objects of the invention in view there is also provided, in accordance with a second embodiment of the invention, a semiconductor module, including:

a housing;

a first chip carrier formed with a first opening and a second chip carrier formed with a second opening, the first and second chip carriers disposed in the housing and disposed one above the other, the first and second openings each being lined with a conductive layer;

a first semiconductor chip provided on the first chip carrier and a second semiconductor chip provided on the second chip carrier; and an intermediate layer provided between the first chip carrier and the second chip carrier; and a first conductive projection and a second conductive projection electrically connected to one another and disposed opposite from one another on the intermediate layer, the first conductive projection at least partly engaging into the first opening, the second conductive projection at least partly engaging into the second opening.

In other words, the second embodiment of the invention provides a semiconductor module having a plurality of semiconductor chips, which are disposed in a housing. At least some of the semiconductor chips disposed on respective chip carriers are provided one above the other and there are conductive connections between the chip carriers of the semiconductor chips provided one above the other. The connections lead through openings in the chip carriers. The openings are lined with a conductive layer. Intermediate layers are provided between the semiconductor chips disposed one above the other or between the chip carrier of one semiconductor chip and the semiconductor chip provided underneath. The intermediate layers have conductive projections, which at least partly engage in the openings of neighboring chip carriers, thereby ensuring mechanical retention between the intermediate layer and the respectively neighboring carrier. Mutually opposite projections are conductively connected to one another.

The projections may be shaped such that they can be fitted in a positively locking manner into an adjoining opening. In this case, the diameter of the projection corresponds to the diameter of the opening. However, it may also be provided that the dimensions of the projections are chosen to be greater than the dimensions of the openings. In that case, however, the projections must be formed similarly to a truncated cone, such that at least some of the projections protrude into the opening in the form of a tip, in which case, on a circumferential line of its cone shape, the projection bears on the edge of the opening and thus establishes the conductive contact with the conductive layer in the opening. In order to ensure a continuous conductive connection between a plurality of planes of the semiconductor module, mutually opposite projections of the intermediate layer are conductively connected to one another.

The intermediate layers may be provided in a releasable manner in the semiconductor module, with the result that individual semiconductor chips or individual chip carriers with the semiconductor chips provided thereon can be removed from the module, for example in order to replace defective semiconductor chips. However, the intermediate layers may also be connected to at least one of the chip carriers by a soldered connection.

The conductive connections in the semiconductor module can, in principle, extend over all the planes of the semiconductor module, that is to say over all the planes of the semiconductor chips and chip carriers provided one above the other. However, the conductive connections may be configured such that they respectively extend only over some of the planes of the chip carriers disposed one above the other, in order thus to connect to one another only some of the semiconductor chips provided one above the other.

In accordance with another feature of the invention, a thermally conducting layer is provided between the first and second semiconductor chips.

Other features which are considered as characteristic for the invention are set forth in the appended claims.

Although the invention is illustrated and described herein as embodied in a semiconductor module having interconnected semiconductor chips provided one above the other, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3b is a bottom plan view of the conductive connection of FIG. 3a;

DESCRIPTION OF THE PREFERRED EMBODIMENTS

Figure 1:
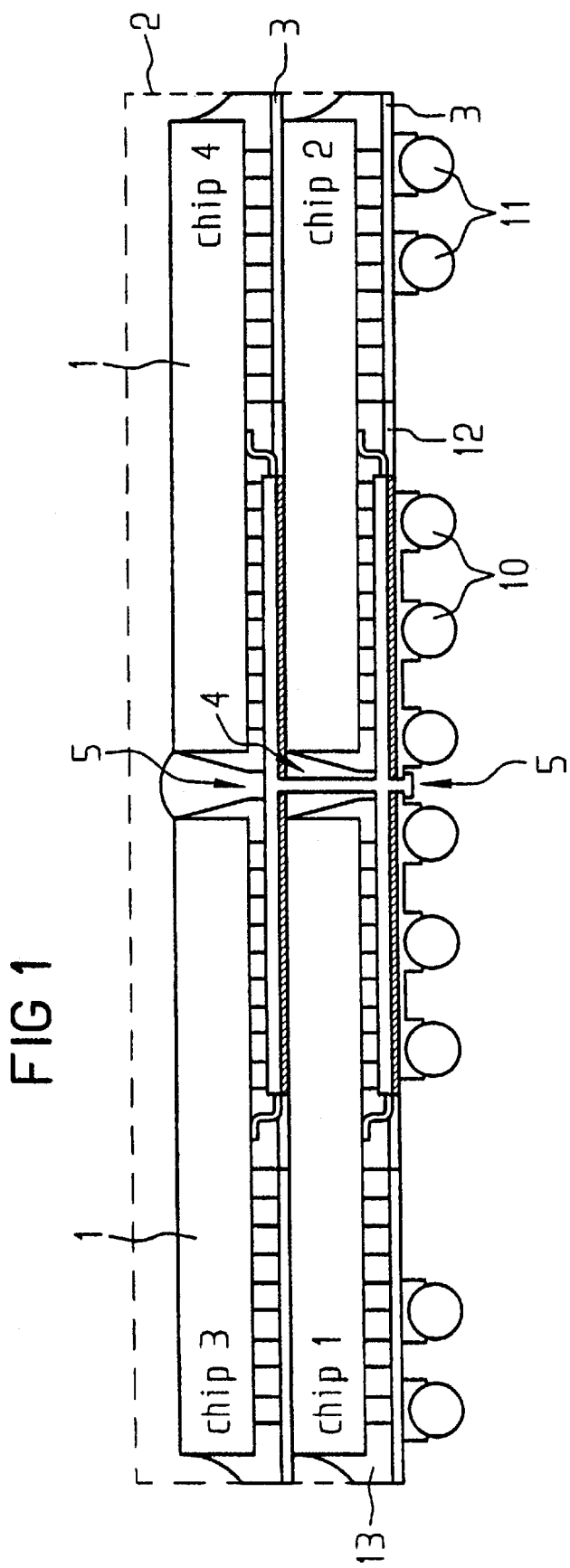
FIG. 1 is a sectional side view of a semiconductor module according to the invention having four semiconductor chips provided in two planes one above the other.
Figure 3A:
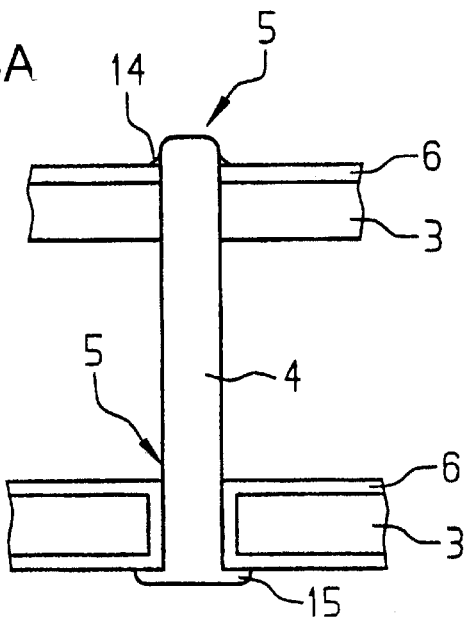
FIG. 3a is a diagrammatic, partial sectional side view of the conductive connection in the form of a plug-in connection.

Referring now to the figures of the drawings in detail and first, particularly, to FIG. 1 thereof, there is shown a semiconductor module including four semiconductor chips 1, which are stacked in two planes on chip carriers 3, wherein respective two semiconductor chips 1 are in each case disposed on a common chip carrier 3. In the case of such a semiconductor module, the lower chip carrier 3 generally has a metallization layer on both sides FIG. 3a illustrates a conductive layer 6 for the lower one of the chip carriers 3. The metallization layer on the lower side serves for making contact with terminals 10, which may be configured as solder balls for example, as illustrated in FIG. 1. However, these terminals 10 may also be realized in the form of pins. On the opposite side, the metallization layer serves for establishing a conductive connection 12 to the semiconductor chips 1 of the first plane. The chip carriers 3 of the second or possibly further planes may also be provided with a metallization layer only on one side, as has likewise been indicated in FIG. 3a for the upper chip carrier 3.

The chip carriers each have openings 5 through which conductive connections 4 to the chip carriers 3 of the other planes are established. The semiconductor module may be surrounded by a closed-off housing 2, as has been indicated by the dashed line in FIG. 1. However, the semiconductor module may also be realized as a chip size package CSP. In this case only that part of the semiconductor chips 1, in which the terminals of the respective semiconductor chip are disposed toward the chip carrier, is surrounded by an encapsulation composition 13. In this case, the remaining region of the semiconductor chip 1 need not be enclosed by an encapsulation composition or a housing, so that, as shown by FIG. 1, at least the topmost one of the semiconductor chips is not enclosed by a housing or an encapsulation composition at its upper surface.

In addition to the electrical terminals 10 of the semiconductor module, further contact balls or contact pins 11 may additionally be provided on the underside of the module, and can be used to stabilize the semiconductor module during the mounting of the semiconductor module.

Figure 2:
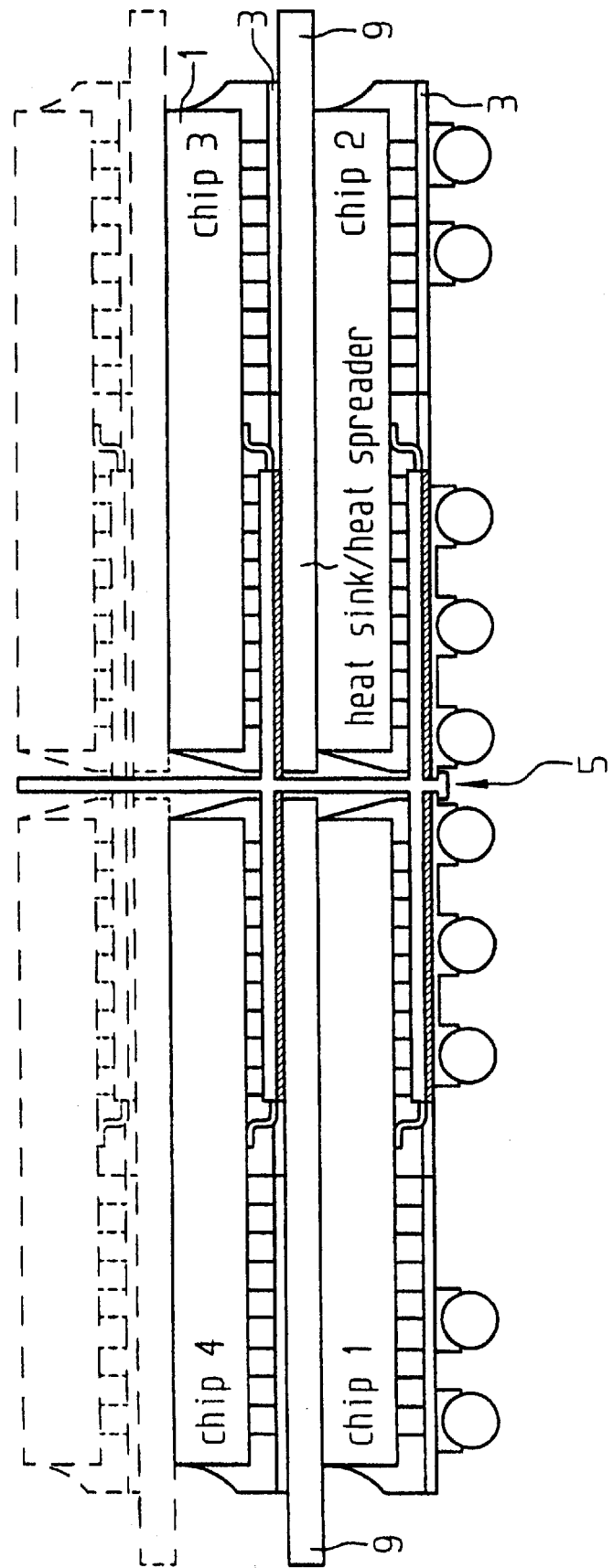
FIG. 2 is a sectional side view of a semiconductor module according to the invention having two or more planes of semiconductor chips and a thermally conductive layer between the semiconductor chips.

As illustrated in FIG. 2, it is also possible to provide more than two planes of semiconductor chips in a semiconductor module. In order to ensure better dissipation of heat between the semiconductor chips, a thermally conductive layer 9 may be provided between the semiconductor chips 1 or between a semiconductor chip 1 and the chip carrier 3 lying above it. This thermally conductive layer transports the heat, which is produced during operation, away along the region between the semiconductor chips 1. This thermally conductive layer 9 may be connected to an external heat sink in order to ensure better cooling of the semiconductor module.

FIG. 3a shows a first exemplary embodiment of a conductive connection 4 between two chip carriers 3, in which case a plug-in connection is led through in each case mutually opposite openings 5 in the chip carriers 3, thereby producing a conductive connection between the chip carriers in the direction perpendicular to the plane of the chip carriers 3. In the example according to FIG. 3a, the plug-in connection is provided with a widened head 15 on its underside in order to secure it against the possibility of sliding out. On the topside of the upper chip carrier 3, in contrast, a soldered connection 14 is provided in order to fix the plug-in connection. However, the plug-in connection could also be introduced into the openings 5 in a releasable manner. In this case the plug-in connection must then be provided in such a way that, in the subsequent operating state, the head 15 or another suitable device prevents the plug-in connection from sliding out of the openings 5.

Figure 3B:
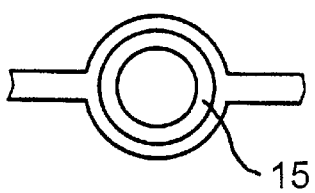

FIG. 3b is a bottom plan view of the conductive connection of FIG. 3a and illustrates the head 15 of the conductive plug-in connection 4.

Figure 4:
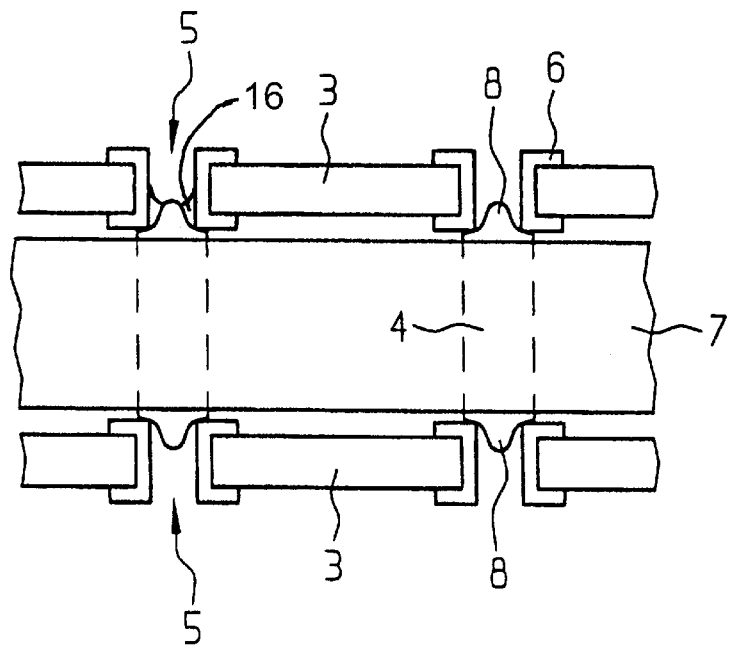
FIG. 4 is a diagrammatic, partial sectional side view of the conductive connection in the form of an intermediate layer with projections.

FIG. 4 shows an alternative exemplary embodiment for establishing the conductive connections between the chip carriers 3. In this case, conductive layers 6 are provided, which line the openings 5 in the chip carriers 3. Such conductive layers 6 in the openings may, in principle, also be provided in the example according to FIG. 3a, but are not absolutely necessary in that case. An intermediate layer 7 is now provided, which is disposed between the chip carriers 3 and establishes the conductive connection between two chip carriers 3. Extensions 8 are provided on the intermediate layer and engage at least partly in the openings 5. As shown by FIG. 4, the extensions are configured in the form of a cone, in which case the tip of the cone engages in the openings 5 and a circumferential line of the cone bears on the edge of the opening 5 and thus establishes a conductive connection between the extensions 8 and the conductive layer 6. The fact that the tips of the extensions 8 engage in the openings 5 largely prevents shear movements between the intermediate layer 7 and the chip carriers 3, with the result that slipping of the chip carriers 3 relative to one another and also between the chip carriers 3 and the intermediate layer 7 can largely be prevented. In order to allow the semiconductor chips to be placed between the chip carriers 3, either the intermediate layer 7 is provided with corresponding cutouts for accommodating the semiconductor chips 1, or the extensions 8 are provided with a length such that the intermediate layer 7 can be provided between a chip carrier 3 and a semiconductor chip 1 and the extensions 8 each extend from the intermediate layer 7 as far as the neighboring chip carrier 3. A solder connection 16 may be provided for connecting the intermediate layer 7 to at least one of the chip carriers 3.

Figure 5:
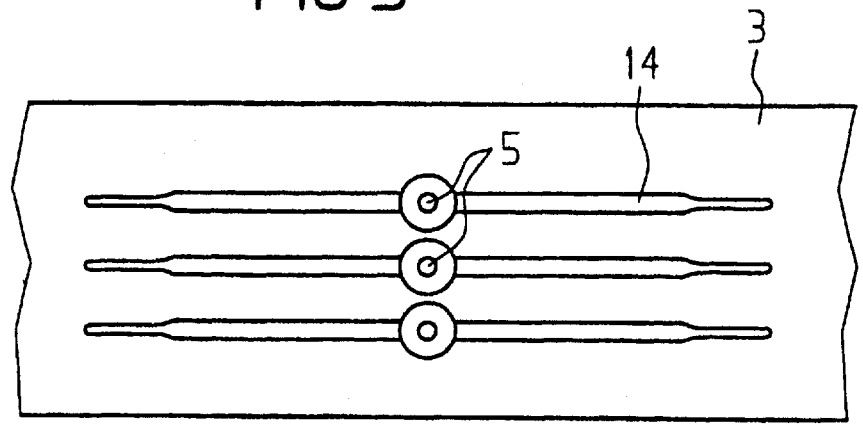
FIG. 5 is a diagrammatic partial plan view of conductor tracks on a chip carrier.
Figure 6:
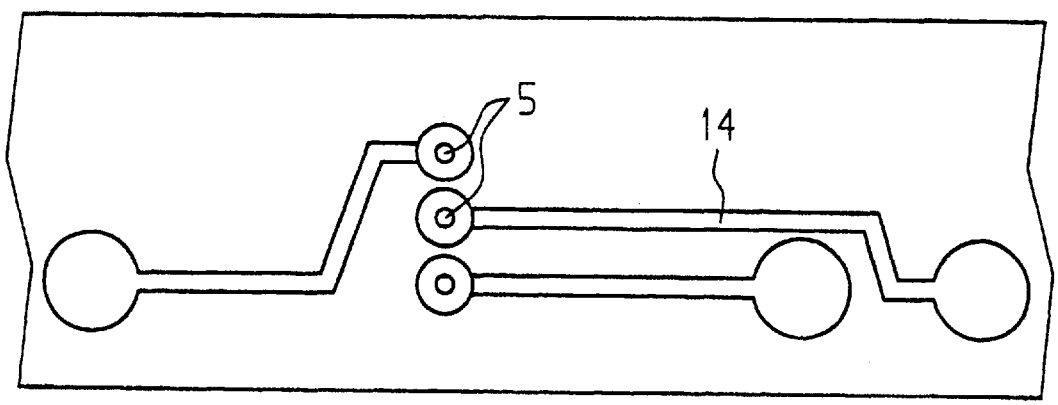
FIG. 6 is a diagrammatic partial plan view of conductor tracks according to FIG. 5, but with an offset configuration of the contact-making points for the semiconductor chips on the chip carrier.

FIGS. 5 and 6 show examples of a configuration of conductor tracks 14 on a chip carrier 3 in a diagrammatic illustration. The semiconductor chips 1 are respectively mounted on the chip carrier 3 and are connected via a conductive connection 12 to the conductor tracks 14 on the chip carrier 3. These conductor tracks 14 lead in turn to the openings 5 in the chip carrier, via which the conductive connection 4 to the remaining planes is established. The conductor tracks 14 and also the terminal points at the end of the conductor tracks for making contact with the semiconductor chips 1 may in this case either be provided in a row, as shown by FIG. 5; however, it is also possible for the conductor tracks 14 and the terminal points to be provided in an offset manner.

The conductor tracks and terminals on a chip carrier 3 may, for example, be provided mirror-symmetrically with respect-to the center of the chip carrier 3, the openings 5 being provided in the center of the chip carrier. Respectively mirror-symmetrically configured semiconductor chips may then be mounted onto the corresponding half of the chip carrier, in order to establish contact between the semiconductor chips and also between the individual planes in the simplest possible manner. The semiconductor chips are then addressed via a common contact configuration using the solder balls or contact pins 10. In this case a common chip select line may also be provided for all the semiconductor chips 1 or a respective separate chip select line may in each case be provided for each individual semiconductor chip 1.

I claim:

1. A semiconductor module, comprising:

a housing;

a first chip carrier and a second chip carrier, said first and second chip carriers disposed in said housing and disposed one above the other;

two semiconductor chips provided on said first chip carrier and two semiconductor chips provided on said second chip carrier;

conductive layers disposed on said first and second chip carriers and conductively connecting said two semiconductor chips on said first chip carrier to one another and conductively connecting said two semiconductor chips on said second chip carrier to one another;

first openings formed in said first chip carrier and second openings formed in said second chip carrier, said first and second openings being lined with said conductive layers;

an intermediate layer, made from insulating material, disposed between said first chip carrier and said second chip carrier, said intermediate layer having first conductive extensions and second conductive extensions disposed opposite from one another on said intermediate layer, and pins electrically connecting said first conductive extensions and said second conductive extensions to one another, said pins extending from an upper surface of said intermediate layer to a lower surface of said intermediate layer, said first conductive extensions at least partly engaging into said first openings and said second conductive extensions at least partly engaging into said second openings to thereby conductively connect said conductive layers disposed on said first chip carrier to said conductive layers disposed on said second chip carrier and to mechanically retain said intermediate layer and said first and second chip carriers to one another; and said first and second openings being disposed in a center of said first and second chip carriers between said two semiconductor chips respectively disposed on each of said first and second chip carriers.

2. The semiconductor module according to claim 1, including a thermally conducting layer provided between said first and second chip carriers.

3. The semiconductor module according to claim 1, wherein said intermediate layer is a releasable intermediate layer.

4. The semiconductor module according to claim 1, including a solder connection for connecting said intermediate layer to at least one of said first and second chip carriers.

5. A semiconductor module, comprising:

a housing;

a first chip carrier and a second chip carrier, said first and second chip carriers disposed in said housing and disposed one above the other;

two semiconductor chips provided on said first chip carrier and two semiconductor chips provided on said second chip carrier;

conductive layers disposed on said first and second chip carriers and conductively connecting said two semiconductor chips on said first chip carrier to one another and conductively connecting said two semiconductor chips on said second chip carrier to one another;

first openings formed in said first chip carrier and second openings formed in said second chip carrier, said first and second openings being lined with said conductive layers;

an intermediate layer, made from insulating material, disposed between said first chip carrier and said second chip carrier, said intermediate layer having first conductive extensions and second conductive extensions disposed opposite from one another on said intermediate layer, and pins electrically connecting said first conductive extensions and said second conductive extensions to one another, said pins extending from an upper surface of said intermediate layer to a lower surface of said intermediate layer, said first conductive extensions at least partly engaging into said first openings and said second conductive extensions at least partly engaging into said second openings to thereby conductively connect said conductive layers disposed on said first chip carrier to said conductive layers disposed on said second chip carrier and to mechanically retain said intermediate layer and said first and second chip carriers to one another;

said first and second openings being disposed in a center of said first and second chip carriers between said two semiconductor chips respectively disposed on each of said first and second chip carriers, said first and second openings each having an edge; and said first and second conductive extensions being cone-shaped, said cone shape having:
- a cone tip respectively projecting into said first and second openings; and
- a circumferential line bearing on said edge.

6. The semiconductor module according to claim 5, including a thermally conducting layer provided between said first and second chip carriers.

* * * * *